(12) United States Patent
Schrödinger et al.

(10) Patent No.: US 7,609,733 B2
(45) Date of Patent: Oct. 27, 2009

(54) LASER DIODE ASSEMBLY AND DEVICE FOR OPERATING A LASER DIODE

(75) Inventors: Karl Schrödinger, Berlin (DE); Toralf Oheim, Hennigsdorf (DE)

(73) Assignee: Finisar Corporation, Sunnyvale, CA (US)

( * ) Notice: Subject to any disclaimer, the term of this patent is extended or adjusted under 35 U.S.C. 154(b) by 134 days.

(21) Appl. No.: 10/492,463

(22) PCT Filed: Oct. 15, 2001

(86) PCT No.: PCT/DE01/03948

§ 371 (c)(1),
(2), (4) Date: Jul. 27, 2004

(87) PCT Pub. No.: WO03/038955

PCT Pub. Date: May 8, 2003

(65) Prior Publication Data

US 2004/0247005 A1    Dec. 9, 2004

(51) Int. Cl.
*H01S 3/00* (2006.01)
(52) U.S. Cl. ............................... 372/38.02; 372/38.01
(58) Field of Classification Search ............. 372/38.01, 372/38.02
See application file for complete search history.

(56) References Cited

U.S. PATENT DOCUMENTS

| | | | |
|---|---|---|---|
| 4,723,312 A * | 2/1988 | Yamashita et al. | 398/182 |
| 4,845,723 A * | 7/1989 | Heinen et al. | 372/38.02 |
| 5,757,027 A * | 5/1998 | Kuchta | 257/48 |
| 6,068,782 A * | 5/2000 | Brandt et al. | 216/17 |
| 6,269,273 B1 * | 7/2001 | Miller | 700/19 |
| 6,292,500 B1 * | 9/2001 | Kouchi et al. | 372/38.1 |
| 6,704,472 B2 * | 3/2004 | Bylsma et al. | 385/14 |
| 6,728,280 B1 * | 4/2004 | Tatum et al. | 372/43.01 |
| 6,774,448 B1 * | 8/2004 | Lindemann et al. | 257/443 |
| 2002/0097945 A1 * | 7/2002 | Chang et al. | 385/10 |
| 2003/0016711 A1 * | 1/2003 | Crawford | 372/38.02 |
| 2004/0188793 A1 * | 9/2004 | Lindemann et al. | 257/457 |

FOREIGN PATENT DOCUMENTS

| | | |
|---|---|---|
| DE | 159 584 A | 3/1983 |
| DE | 159584 A | 3/1983 |
| JP | 07221405 A * | 8/1995 |
| JP | 08116136 | 7/1996 |
| WO | WO 01/59814 | 8/2001 |
| WO | WO 01/59814 A2 | 8/2001 |

OTHER PUBLICATIONS

International Search Report, International Application No. PCT/DE01/03948 dated Oct. 15, 2001 (3 pgs).

* cited by examiner

*Primary Examiner*—Minsun Harvey
*Assistant Examiner*—Phillip Nguyen
(74) *Attorney, Agent, or Firm*—Workman Nydegger

(57) ABSTRACT

The invention is directed to a laser diode assembly having a laser diode and a support, whereon the laser diode is arranged or formed in one single piece. The laser diode assembly further includes a coupling capacitor integral therewith, wherein the laser diode is subjected to the action of a laser driver circuit via the coupling capacitor associated with the assembly. The invention is also directed to a device for operating a laser diode, wherein the device includes a coupling capacitor integral with a laser diode assembly. The invention enables a reduction in the number of coupling paths between a laser driver circuit and a laser diode assembly, thereby reducing the occurrence of parasitic elements.

9 Claims, 6 Drawing Sheets

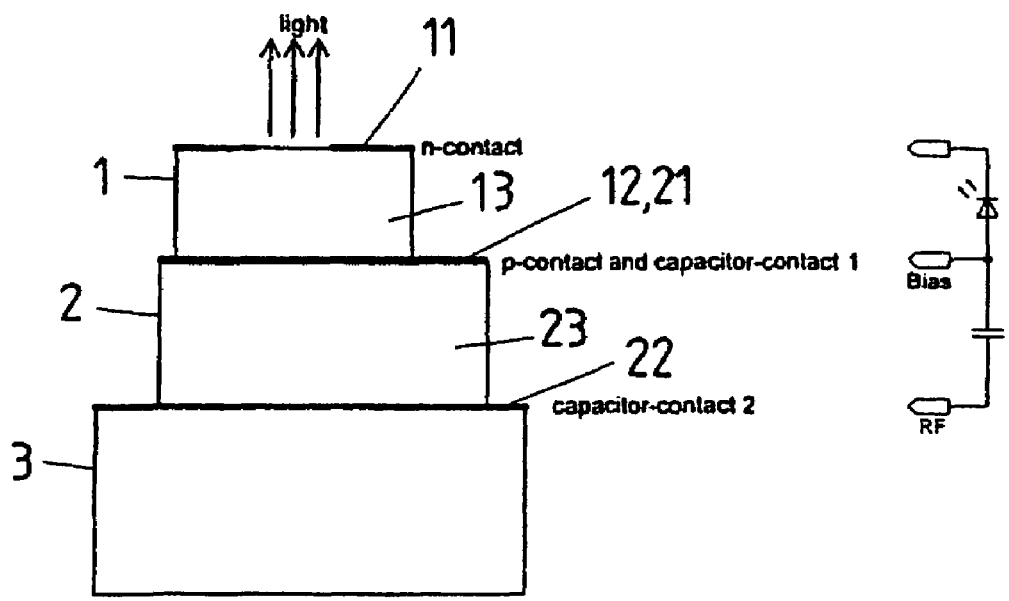
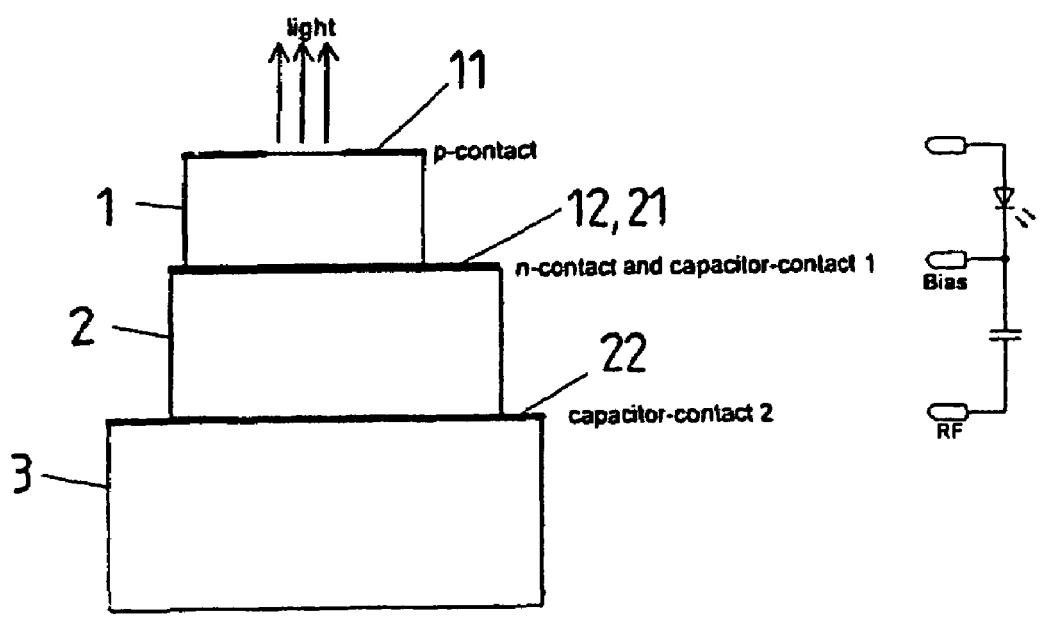

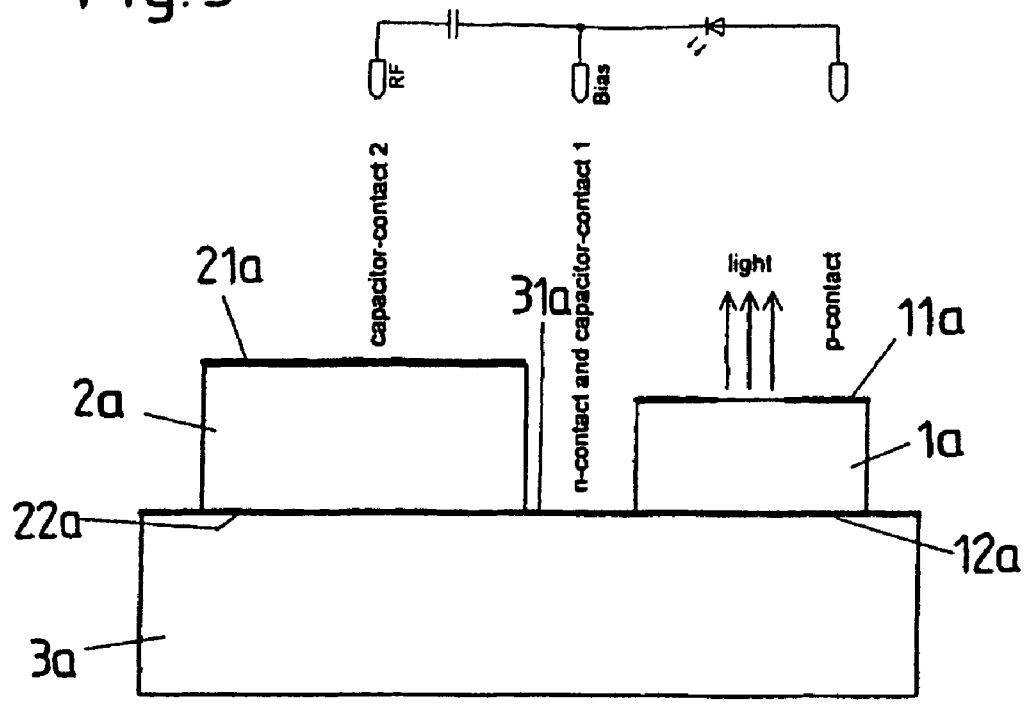
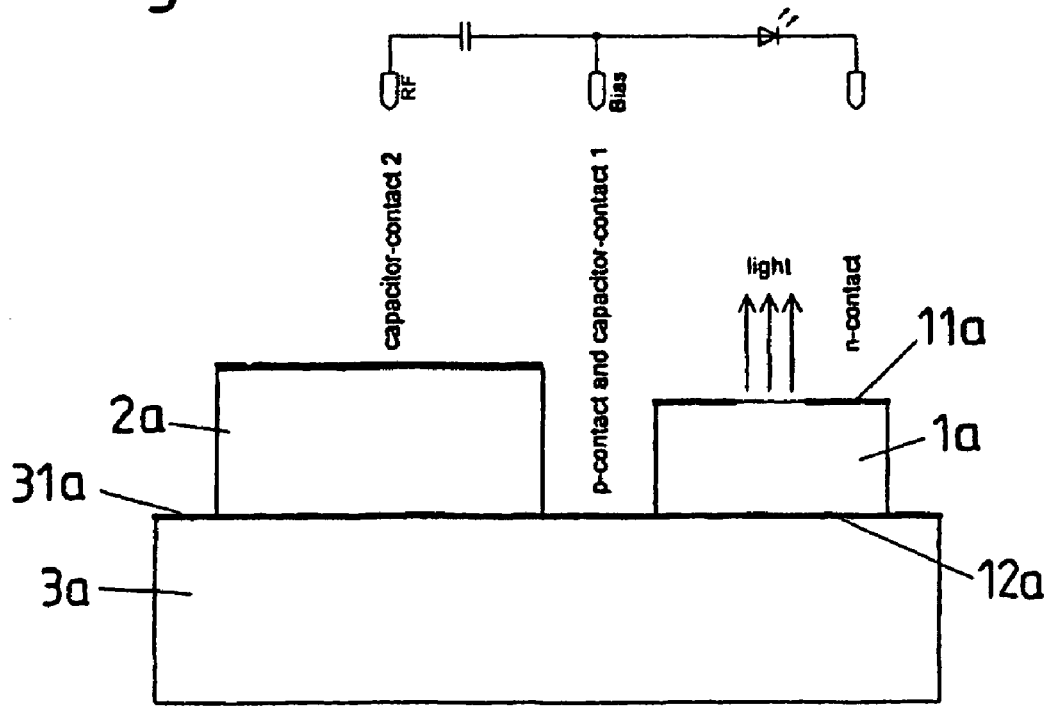

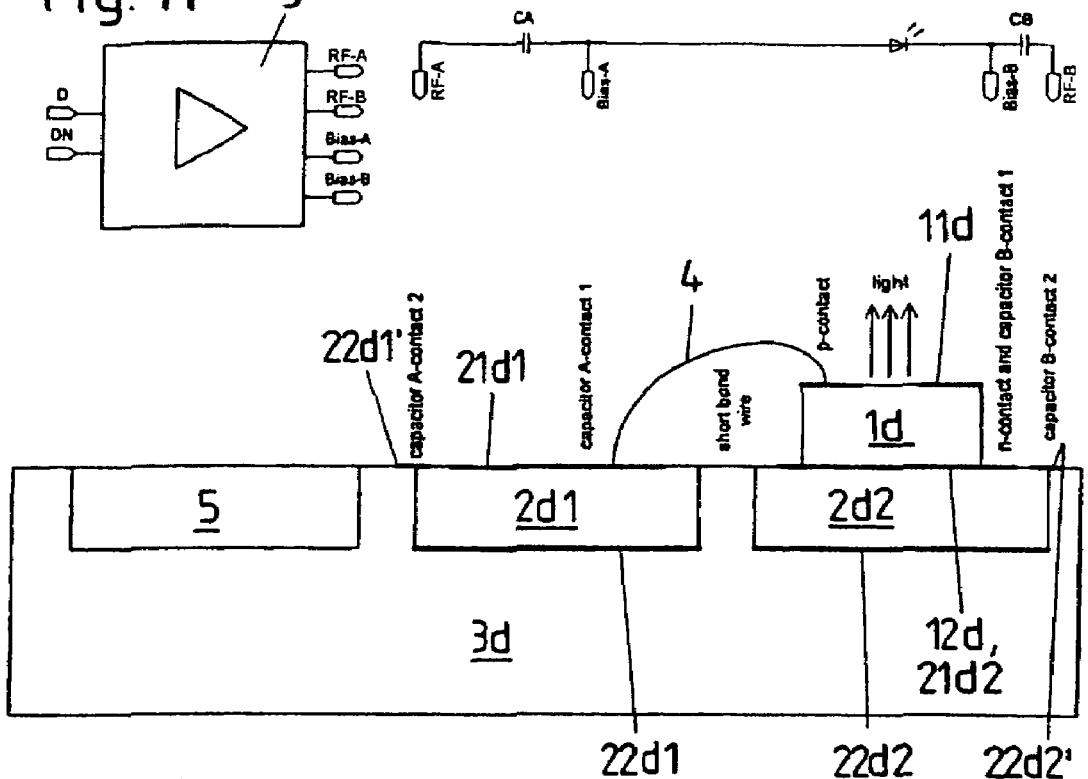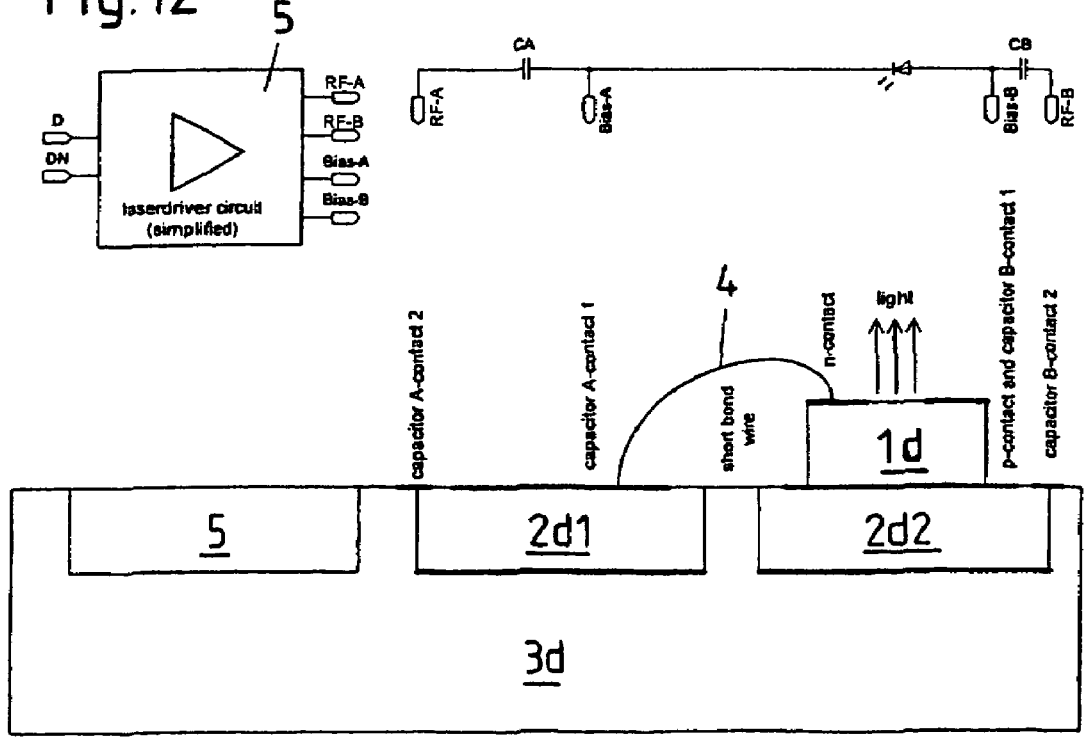

LASER DIODE ASSEMBLY AND DEVICE FOR OPERATING A LASER DIODE

RELATED APPLICATION

This application claims priority to and incorporates by reference International Application No. PCT/DE01/03948 filed Oct. 15, 2001, which is entitled "LASER DIODE ASSEMBLY AND DEVICE FOR OPERATING A LASER DIODE", which was not published in English, which is hereby incorporated by reference in their entirety.

FIELD OF THE INVENTION

The invention relates to a laser diode unit with a coupling capacitance.

BACKGROUND OF THE INVENTION

In order to achieve power losses that are as small as possible, integrated circuits (ICs) for driving laser diodes are being developed for ever decreasing supply voltages. A further motivation for smaller supply voltages is constituted by breakdown criteria of many of the integrated components used.

The operating point of a laser diode to be driven is set by a threshold current and a modulation current, the modulation current representing the data stream. The currents generate a voltage drop across the laser diode. The voltage drop across the diode may be so large that the laser can no longer be driven directly by the laser driver IC on account of the limiting supply voltage.

If the voltage drop across the laser diode is so large that the laser can no longer be driven directly by the laser driver IC on account of the limited supply voltage or the required voltage drops across the driver transistors, then it is known to cause the modulation of the laser diode to be effected by means of a coupling capacitance. In the case of modulation and transmission of the data in the radiofrequency range, however, losses and mismatches due to parasitic elements occur on the coupling paths both from the modulation output of the laser driver IC to the coupling capacitor and from the coupling capacitor to the laser diode coupling unit. Said parasitic units may be, inter alia, bonding wire inductances and pad capacitances.

DD-A-159 584 discloses an intermittently radiating light-emitting or laser diode arrangement in which a AMENDED SHEET light-emitting diode chip is arranged on a carrier. A capacitance to which a signal is applied is situated between the carrier and the light-emitting diode chip. The carrier is an integrated circuit.

SUMMARY OF THE INVENTION

The present invention is based on the object of providing a laser diode unit in which the occurrence of parasitic elements is reduced when using a coupling capacitance between laser driver circuit and laser diode.

This object is achieved according to the invention by means of a laser diode unit having at least one laser diode, an integrated circuit with a surface, on which the laser diode is arranged or formed monolithically, connection contacts for the laser diode and at least one coupling capacitance integrated into the integrated circuit. In this case, the coupling capacitance has a first metallization formed at the surface of the integrated circuit and a second metallization formed within the integrated circuit, the latter metallization being connected to a contact at a surface of the integrated circuit. A signal of a laser driver circuit is applied to the laser diode via the coupling capacitance.

Preferred and advantageous refinements of the invention are specified in the subclaims.

Accordingly, provision is thus made for the coupling capacitance arranged between the output of a laser driver circuit and the laser diode to be integrated into the laser diode unit. This has the advantage that the number of problematic coupling paths from the laser driver circuit through to the laser diode unit is reduced and the occurrence of parasitic elements is reduced. Thus, a separate coupling path between the laser diode unit and an external coupling capacitance, as is provided in the prior art, is obviated on account of the invention's integration of the coupling capacitance into the laser diode unit. This advantage may be utilized both for single-ended and for differential driving of a laser diode or a laser diode array.

It is thus possible for the modulation outputs of a laser driver circuit which is generally formed as an integrated circuit, to be directly connected to the laser diode unit, for example by bonding wires or by means of chip-on-chip mounting.

A laser diode array is understood to be an arrangement of a plurality of laser diodes in a mechanical interconnection. The laser diode unit is formed for this case by the laser diode array, a carrier for the laser diode array, electrical connection contacts and at least one coupling capacitance.

A preferred refinement of the invention provides for the laser diode to be placed by one connection directly (e.g. by adhesive bonding) onto a metallization on the surface of the integrated circuit, which forms a contact of the coupling capacitance. The other connection of the laser diode is preferably realized by a short bonding wire.

In an advantageous development of the invention, the laser driver circuit is also integrated into the integrated circuit or the integrated circuit is the laser driver IC, i.e. the at least one coupling capacitance is concomitantly integrated into the laser driver IC. The laser diode or the laser diode chip is mounted directly on the laser driver IC, the laser diode being connected to the metallization of the laser driver IC by at least one connection and the other connection being realized by a particularly short bonding wire.

BRIEF DESCRIPTION OF THE DRAWINGS

The invention is explained in more detail below using a plurality of exemplary embodiments with reference to the figures of the drawing, in which:

FIG. 1 schematically shows the construction of a first exemplary embodiment of a laser diode unit with an integrated coupling capacitance, the laser diode unit having a p-contact laser diode chip with single-ended driving;

FIG. 2 shows an exemplary embodiment corresponding to FIG. 1 with an n-contact laser diode chip;

FIG. 3 schematically shows the construction of a second exemplary embodiment of a laser diode unit with an integrated coupling capacitance, the laser diode unit having a p-contact laser diode chip with single-ended driving;

FIG. 4 shows an exemplary embodiment corresponding to FIG. 3 with an n-contact laser diode chip;

FIG. 11 schematically shows the construction of a sixth exemplary embodiment of a laser diode unit with an integrated coupling capacitance, the coupling capacitance being integrated into a laser driver IC and a p-contact laser diode chip with differential driving being used, and FIG. 12 shows an exemplary embodiment in accordance with FIG. 11 with an n-contact laser diode chip.

DETAILED DESCRIPTION OF THE INVENTION

Figure 5:
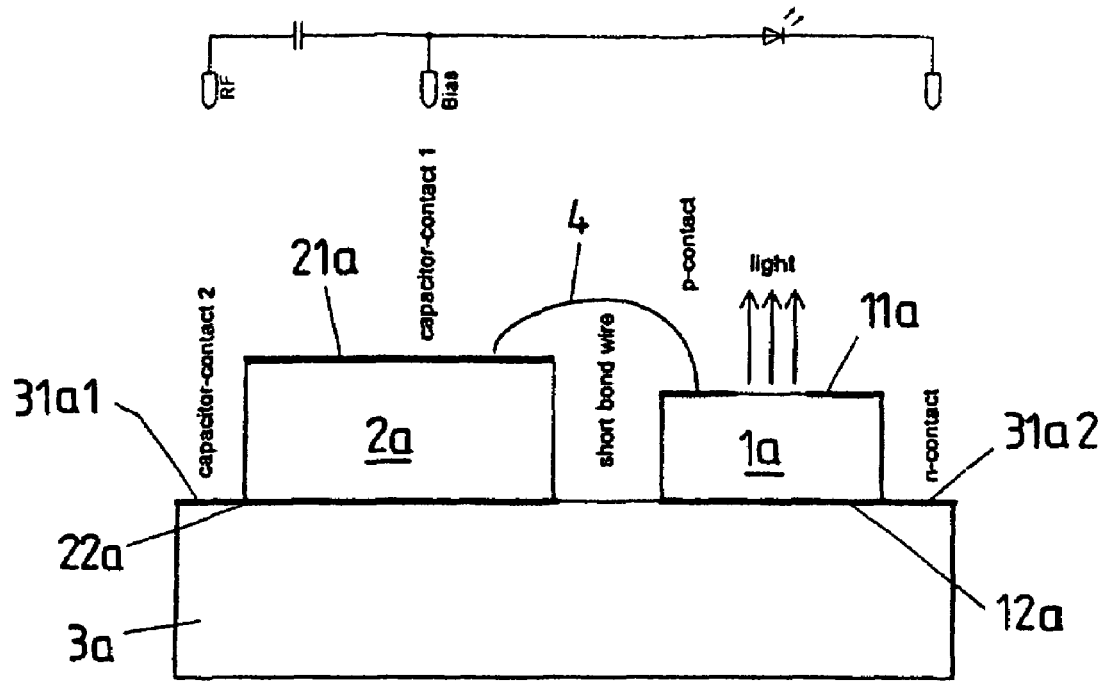
FIG. 5 schematically shows the construction of a third exemplary embodiment of a laser diode unit with an integrated coupling capacitance, the laser diode unit having a p-contact laser diode chip with single-ended driving.

In accordance with FIG. 1, a laser diode chip 1, also referred to as laser diode, a coupling capacitance 2, a carrier/submount 3 and also associated electrical connection contacts form a laser diode unit 100. The laser diode unit may optionally additionally be surrounded by a housing (not illustrated) and be encapsulated with respect to the surroundings by said housing.

In the exemplary embodiment of FIG. 1, the coupling capacitance 2 is arranged between the submount 3 and the laser diode 1, i.e. the coupling capacitance 2 is mounted directly on the submount 3 and the laser diode 1 is mounted directly onto the coupling capacitance 2.

The laser diode 1 has in a manner known per se, a semiconductor laser structure 13, an upper n-contact 11 and a lower p-contact 12. The two contacts 11, 12 are formed by metallic areas. The laser diode 1 is preferable a vertically emitting diode. In principle, however, it is possible to use any desired laser diodes.

The coupling capacitance 2 is formed as a chip capacitance. The capacitor areas of the coupling capacitance 3 are formed by metallized contact areas 21, 22 at the opposite sides of a chip 23 placed onto the submount 3. The submount 3 is a high-impedance substrate with a low parasitic capacitance.

As can be gathered from the circuit diagram on the right-hand side of FIG. 1, the laser diode 1 experiences single-ended driving with a radio frequency (RF) modulating current which is modulated in accordance with a data signal to be transmitted. The RF modulation current is generated by a laser diode driver circuit and applied to the lower contact 22 of the coupling capacitance 2 via a bonding wire, by way of example. A bias current is applied to the laser diode 1 via the upper contact 21 of the coupling capacitance 2. In this case, the bias current is large enough that the laser diode 1 can be operated directly even in the case of a small supply voltage of the laser diode driver circuit of 3.3 V, by way of example.

The upper contact 21 of the coupling capacitance 2 is simultaneously the p contact 12 of the laser diode chip 1. The n-contact 11 of the laser diode chip 1 is fitted on the upper side of the laser diode chip 1 and connected to an electrical reference potential.

Contact is made with the laser diode unit 100 by means of a direct connection of the corresponding outputs of the laser driver circuit to the contacts 22, 21 of the coupling capacitance 2 and, respectively, the contacts 11, 12 of the laser diode chip 1, for example by means of bonding. It is thus possible to connect the outputs of the laser driver circuit directly to the laser diode unit.

The exemplary embodiment of FIG. 2 involves, instead of a p-contact laser diode, an n-contact laser diode, the lower contact 12 of which is the p-contact and the upper contact 11 of which is the n-contact. Otherwise, there are no differences with respect to the embodiment of FIG. 1.

In the exemplary embodiment of the FIG. 3, the coupling capacitance 2a is again formed as a chip capacitance with an upper contact 21a and a lower contact 22a. However, the coupling capacitance 2a is arranged next to the p-contact laser diode chip 1a on the submount 3a. In this case there is provided on the surface of the submount 3a a continuous contact-connection 31a, which comprises both the lower contact-connection 22a of the coupling capacitor 2a and the n-contact 12a of the laser diode 1a and via which the bias current is applied. The RF modulation current is fed via the upper contact 21a of the coupling capacitance. The p-contact 11a of the laser diode 1a is again connected to an electrical reference potential.

For the rest, reference is made to the explanations concerning FIG. 1. In the exemplary embodiment of FIG. 4, the only difference with respect to the exemplary embodiment of FIG. 3 again consists in the formation of the laser diode as an n-contact laser diode. The common contact-connection 31a is correspondingly located at the p-contact of the laser diode chip 1a.

The exemplary embodiment of FIG. 5 shows an alternative exemplary embodiment to the exemplary embodiment of FIG. 3 insofar as no common contact-connection is provided on the surface of the submount 3a. In this exemplary embodiment, the radiofrequency signal is applied to a contact pin 31a1 on the submount 3a, which is connected to the lower contact 22a of the coupling capacitance 2a. The bias current is applied to the upper contact 21a of the coupling capacitance 2a. Contact is made with the p-contact 11a of the laser diode chip 1a via a short bonding wire 4 from the upper contact 21a of the coupling capacitance 2a. The lower n-contact 12a of the laser diode 1a is connected to an electrical reference potential via a further contact pin 31a2. Consequently, the p-contact 11a is the "hot" contact in this exemplary embodiment.

The connection of the contacts of the laser diode unit to the corresponding outputs of the laser driver circuit is preferably again effected via bonding wires.

Figure 6:
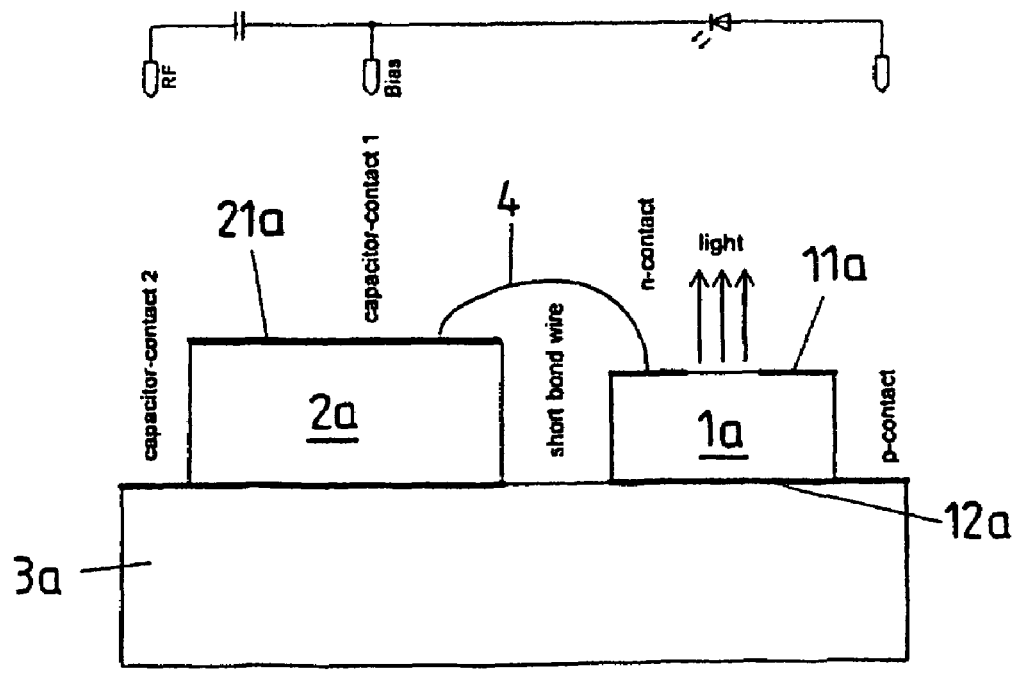
FIG. 6 shows an exemplary embodiment corresponding to FIG. 5 with an n-contact laser diode chip.

FIG. 6 shows the construction of FIG. 5 in the case of a laser unit with an n-contact laser diode chip 11a.

FIGS. 1 to 6 have illustrated circuit arrangements in which a laser diode has been driven in single-ended fashion. The subsequent exemplary embodiments of FIGS. 7 to 12 show arrangements with differential driving of a laser diode. In this case, a laser driver circuit in each case feeds a differential modulation current via a contact RF-A and a contact RF-B and the bias-current current supply is realized via contacts bias-A and bias-B have mutually inverse signals, so that the laser diode is driven with a doubled amplitude.

Figure 7:
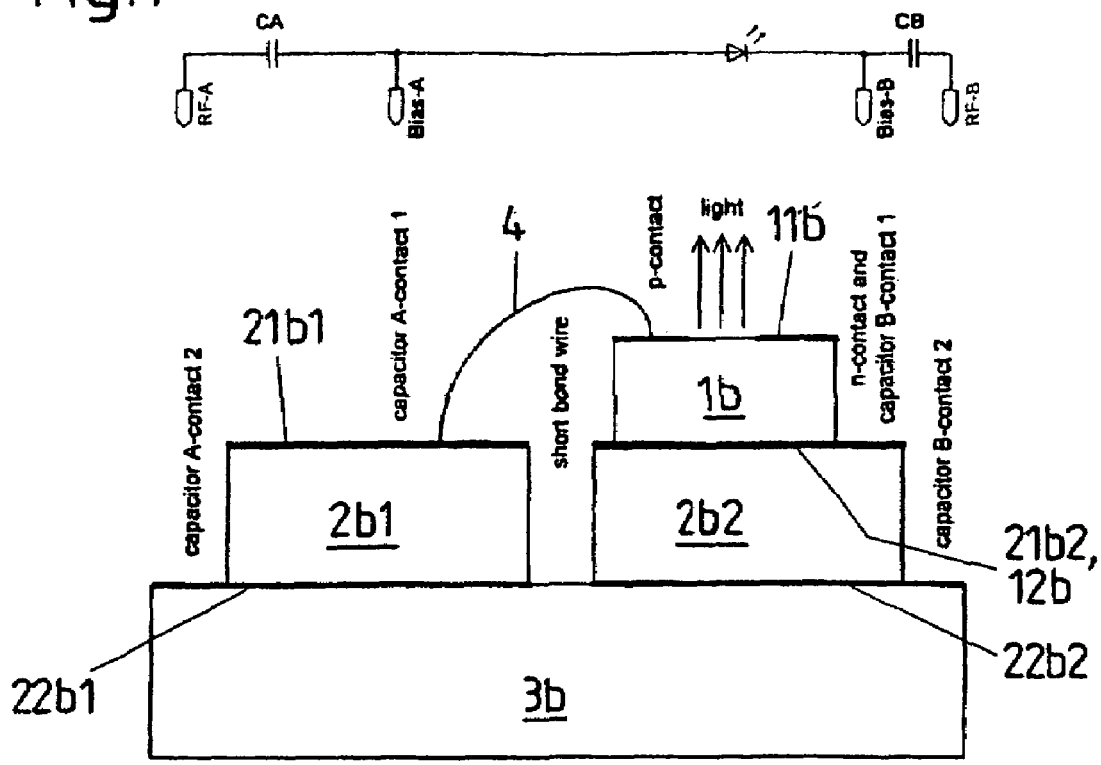
FIG. 7 schematically shows the construction of a fourth exemplary embodiment of a laser diode unit with an integrated coupling capacitance, the laser diode unit having a p-contact laser diode chip with differential driving.

In the exemplary embodiment of FIG. 7, two coupling capacitors 2b1, 2b2 are arranged next to one another on a submount 3b. A p-contact laser diode chip 1b is arranged above one coupling capacitor 2b2 in a manner similar to that in FIG. 1. A short bonding wire 4 extends from the top p-contact 11b of the laser diode chip 1b to the upper contact or to the upper capacitor area 21b1 of the other coupling capacitor 2b1. The RF modulation current RF-A is present at the lower contact 22b2 of the left-hand coupling capacitor 2b1 and the RF modulation current RF-B is present at the lower contact 22b1 of the right-hand coupling capacitor 2b2. The bias currents bias-A and bias-B are fed via the respective other contacts 21b1, 21b2 of the coupling capacitors.

Figure 8:
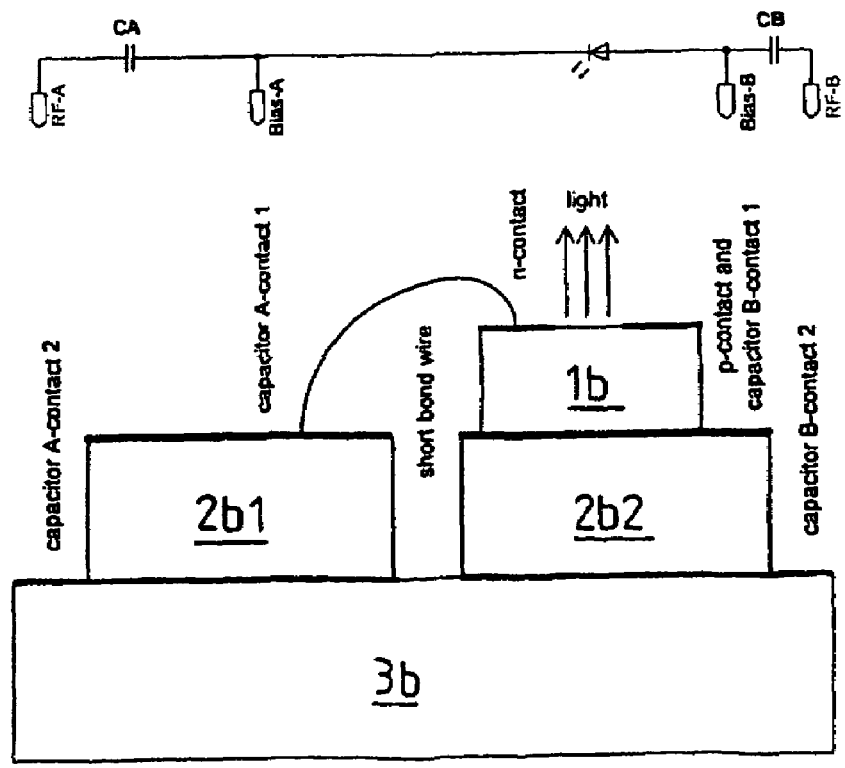
FIG. 8 shows an exemplary embodiment corresponding to FIG. 7 with an n-contact laser diode chip.

FIG. 8 shows the same situation in the case of an n-contact laser diode chip.

Figure 9:
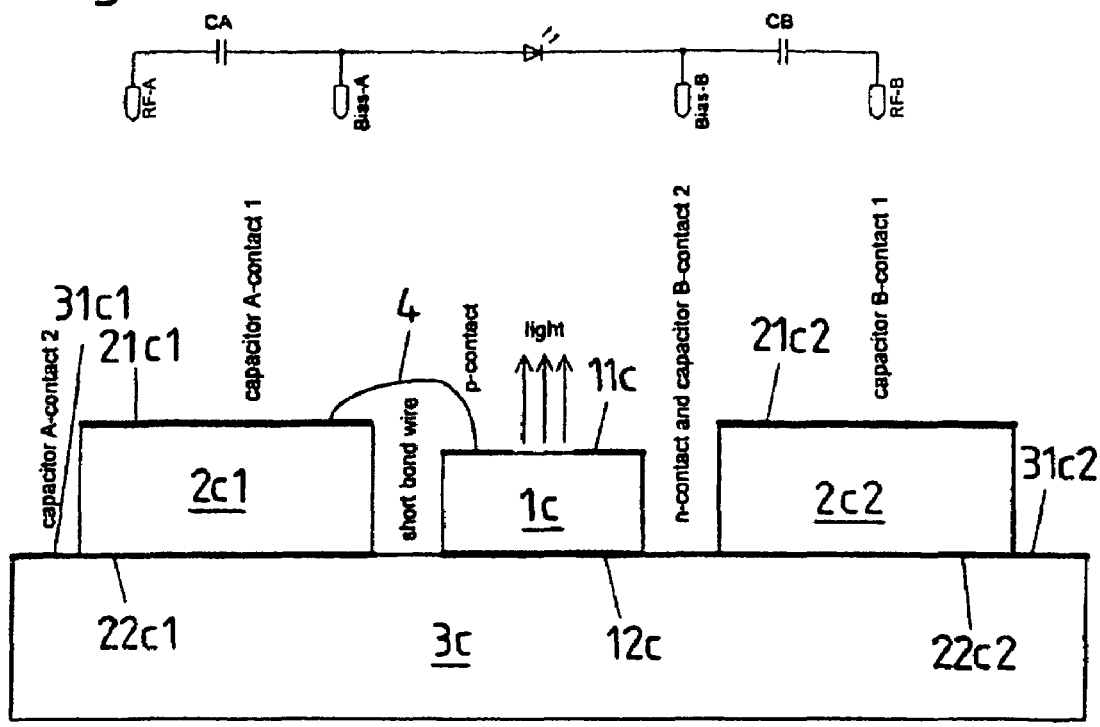
FIG. 9 schematically shows the construction of a fifth exemplary embodiment of a laser diode unit with an integrated coupling capacitance, the laser diode unit having a p-contact laser diode chip with differential driving.
Figure 10:
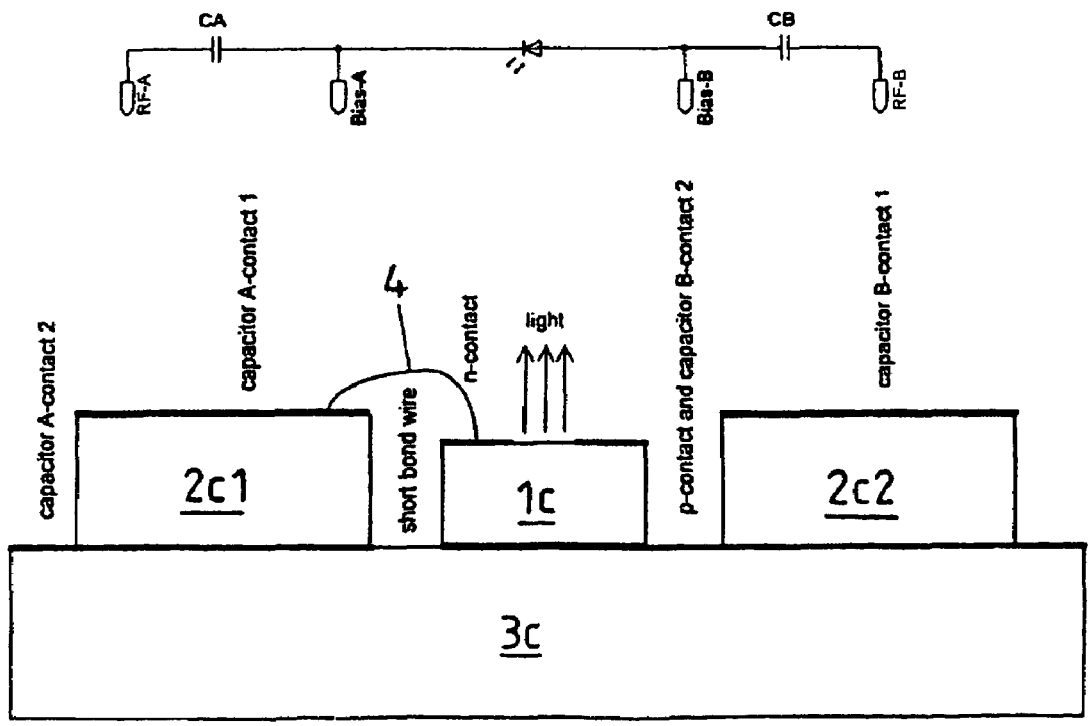
FIG. 10 shows an exemplary embodiment corresponding to FIG. 9 with an n-contact laser diode chip.

In the exemplary embodiment of FIG. 9, two coupling capacitors 2c1, 2c2 and a laser diode chip 1c are in each case arranged directly on a submount 3c, the laser diode chip 1c being arranged between the two coupling capacitances 2c1, 2c2. The submount 3c has two mutually separate contact areas 31c1, 31c2, one coupling capacitor 2c1 being arranged on one contact area 31c2 and the other coupling capacitor 2c2 and the laser diode 1c being arranged on the other contact area 31c2 by their respective contacts 22ca, 22c2, 12c. A connection between the laser diode 1c and the left-hand coupling capacitance 2c1 is again effected via a short bonding wire 4.

The RF modulation currents RF-A, RF-B are fed via the lower contact 22c1 of the left-hand coupling capacitance 2c1 and the upper contact 21c2 of the right-hand coupling capacitance 2c2, and the bias currents bias1, bias 2 are fed via the upper contact 21c1 of the left-hand coupling capacitance 2c1 and one contact area 31c2 of the submount 3c, which is connected to the lower n-contact 12c of the laser diode 1c.

FIG. 10 again shows the corresponding arrangement when using an n-contact laser diode chip.

It is pointed out that, in the exemplary embodiments of FIGS. 1 to 10, the coupling capacitance or the coupling capacitances may also be integrated monolithically into the submount instead of as a chip capacitance. In this case, the laser chip 1 is mounted on the submount. This embodiment variant has the advantage that separate production and mounting of the coupling capacitances is not necessary and a higher integration density is achieved. In principle, it is likewise conceivable for the laser diode also to be formed monolithically with the other components.

FIG. 11 shows a further exemplary embodiment, in which two coupling capacitors 2d1, 2d2 are integrated into a carrier 3d, which constitutes a chip with an integrated circuit and contains, in particular, a laser driver circuit 5, to which two mutually inverted input signals D, DN are fed and which generates therefrom modulation currents RF-A, RF-B and bias currents bias-A, bias-B for the differential driving of the laser diode 1d.

The coupling capacitors 2d1, 2d2 in each case have a metallization 21d1, 21d2 formed at the surface of the integrated circuit or laser driver IC and a metallization 22d1, 22d2 formed within the laser driver IC, the latter metallization in each case being led to the chip surface via a vertical connection and forming contacts 22d1', 22d2' there.

The laser diode chip 1d is mounted directly (chip-on-chip) onto the integrated circuit or laser driver IC 3d. In this case, the lower n-contact 12d of the laser diode 1d is directly connected to a metallization on the laser driver IC which forms one metallization and contact area 21d2 of the right-hand coupling capacitor 2d2. By way of example, the laser diode 1d is connected to the right-hand coupling capacitance 2d2 by adhesive bonding.

The other connection of the laser diode 1d is realized by means of a short bonding wire to one contact 21d1 of the left-hand coupling capacitance 2d1.

The RF modulation currents RF-A, RF-B are fed via the contact 22d1' of the left-hand coupling capacitance 2d1, said contact being connected to the lower metallization 22d1, and the contact 22d2' of the right-hand coupling capacitance 2d2, said contact being connected to the lower metallization 22d2, and the bias currents bias1, bias 2 are fed via the upper contact 21d1 of the left-hand coupling capacitance 2d1 and the upper contact 21d2 of the right-hand coupling capacitance 2d2.

By virtue of the coupling capacitances being integrated into the laser driver IC 5, it is possible to effect very short bonding connections (not illustrated) between the laser driver IC 5 and the laser diode 1d or the coupling capacitors 2d1, 2d2, thereby further reducing the occurrence of undesirable parasitic capacitances or inductances.

Finally, FIG. 12 shows the arrangement of FIG. 11 for the case where an n-contact laser diode is used, the same construction being used.

The embodiment of the invention is not restricted to the exemplary embodiments illustrated above.

For example, the specific arrangements and interconnections of the submount, coupling capacitances and laser diode are to be understood only by way of example. It may also be provided that coupling capacitances are integrated into a laser diode unit in which a plurality of laser diodes are arranged in a laser diode array in a manner known per se.

All that is essential to the invention is that the coupling capacitance or the coupling capacitances are integrated into the laser diode unit.

The invention claimed is:

1. A laser diode unit, comprising:
   at least one laser diode,
   an integrated circuit with a surface, on top of which the laser diode is arranged or formed monolithically,
   connection contacts associated with the laser diode, and
   at least one coupling capacitance integrated into the integrated circuit,
   the coupling capacitance comprising a first metallization formed at the surface of the integrated circuit and a second metallization formed within the integrated circuit, the second metallization being connected to a contact at the surface of the integrated circuit, and
   a signal of a laser driver circuit being applied to the laser diode via the coupling capacitance, wherein the laser driver circuit has a first surface formed at the surface of the integrated circuit and a second surface formed within the integrated circuit.

2. The laser diode unit as claimed in claim 1, wherein the laser diode is placed by a connection onto the first metallization formed at the surface of the integrated circuit.

3. The laser diode unit as claimed in claim 2, wherein another connection of the laser diode is realized by a bonding wire.

4. The laser diode unit as claimed in claim 1, wherein the laser diode unit comprises a single-ended driving configuration, wherein the coupling capacitance comprises a coupling capacitor coupled to the laser diode.

5. The laser diode unit as claimed in claim 1, wherein the laser diode unit comprises a differential driving configuration, wherein the coupling capacitance comprises two coupling capacitors coupled to the laser diode.

6. The laser diode unit as claimed in claim 1, wherein the laser diode unit comprises a plurality of laser diodes integrated into a laser diode array which, together with a carrier, the connection contacts and the at least one coupling capacitance, forms the laser diode unit.

7. A laser diode assembly, comprising:
   a semiconductor body containing a laser driver circuit configured to provide a bias current and a modulation current, wherein the laser driver circuit has a first surface formed at a surface of the semiconductor body and a second surface formed within the semiconductor body;

a laser diode formed or arranged entirely on the surface of the semiconductor body in a monolithic manner, the laser diode comprising first and second connection contacts associated therewith;

a coupling capacitance formed within the semiconductor body and defining first and second surfaces, wherein the first surface is coplanar with the surface of the semiconductor body and the second surface resides within the semiconductor body, the coupling capacitance further comprising first and second metallizations associated with the first and second surfaces, respectively;

wherein the first connection contact of the laser diode is coupled to the first metallization of the coupling capacitance; and wherein the bias current is coupled to the first metallization of the coupling capacitance and the modulation current is coupled to the second metallization of the coupling capacitance.

8. The laser diode assembly of claim 7, wherein the laser diode is formed on the first metallization of the coupling capacitance such that the first connection contact makes electrical contact thereto.

9. The laser diode assembly of claim 8, further comprising a second coupling capacitance formed within the semiconductor body and defining first and second surfaces, wherein the first surface is associated with the surface of the semiconductor body and the second surface resides within the semiconductor body, the second coupling capacitance further comprising first and second metallizations associated with the first and second surfaces, respectively;

wherein the laser driver circuit is further configured to provide a second bias current and a second modulation current;

wherein the second bias current is coupled to the first metallization of the second coupling capacitance, and the second modulation current is coupled to the second metallization of the second coupling capacitance; and wherein the first metallization of the second coupling capacitance is coupled to the second connection contact of the laser diode.

* * * * *

UNITED STATES PATENT AND TRADEMARK OFFICE
CERTIFICATE OF CORRECTION

PATENT NO. : 7,609,733 B2
APPLICATION NO. : 10/492463
DATED : October 27, 2009
INVENTOR(S) : Schrödinger et al.

Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 487 days.

Signed and Sealed this

Twelfth Day of October, 2010

David J. Kappos
*Director of the United States Patent and Trademark Office*